(12) United States Patent
Jacobson et al.

(10) Patent No.: US 6,247,629 B1
(45) Date of Patent: Jun. 19, 2001

(54) WIRE BOND MONITORING SYSTEM FOR LAYERED PACKAGES

(75) Inventors: John O. Jacobson; Derek J. Gochnour; Steven G. Thummel, all of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/246,668

(22) Filed: Feb. 5, 1999

Related U.S. Application Data

(62) Division of application No. 08/925,507, filed on Sep. 8, 1997, now Pat. No. 6,085,962.

(51) Int. Cl.[7] ............................. B23K 37/00; B23K 31/02
(52) U.S. Cl. ........................... 228/4.5; 228/9; 228/104; 228/180.5
(58) Field of Search .................................... 228/102, 103, 228/104, 105, 131, 110.1, 4.5, 180.5, 8, 9, 10

(56) References Cited

U.S. PATENT DOCUMENTS

| | | | |
|---|---|---|---|
| 3,840,169 | * 10/1974 | Steranko et al. | 228/4 |
| 4,443,178 | * 4/1984 | Zingher | 156/64 |
| 4,578,279 | * 3/1986 | Zingher | 427/10 |
| 4,998,002 | * 3/1991 | Okikawa et al. | 219/56.22 |
| 5,049,813 | * 9/1991 | Van Loan et al. | 324/158 F |
| 5,166,605 | * 11/1992 | Daum et al. | 324/158 F |
| 5,180,976 | * 1/1993 | Van Loan et al. | 324/158 F |
| 5,238,173 | * 8/1993 | Ura et al. | 228/104 |
| 5,334,857 | * 8/1994 | Mennitt et al. | 257/48 |
| 5,420,500 | * 5/1995 | Kerschner | 324/72.5 |
| 5,834,334 | * 11/1998 | Leedy | 438/107 |
| 5,918,107 | * 6/1999 | Fogal et al. | 438/15 |

FOREIGN PATENT DOCUMENTS

| | | |
|---|---|---|
| 404192538A | * 7/1992 | (JP). |
| 407324906A | * 12/1995 | (JP). |
| 409232361A | * 9/1997 | (JP). |

\* cited by examiner

*Primary Examiner*—Clifford C. Shaw
*Assistant Examiner*—Kiley Stoner
(74) *Attorney, Agent, or Firm*—Trop, Pruner & Hu, P.C.

(57) ABSTRACT

A wire bond monitoring system for monitoring wire bonds made on layered packages includes a technique for accessing both the die and the laminate package and making electrical contact thereto so as to test the continuity of the wire bond connection. An electrical connection can be made to a metal trace between the die and the laminate package by contacting a via extending downwardly through the package. Alternatively, a contact may be made from above using a flexible contact. The flexible contact may be attached to the wire bond clamp.

9 Claims, 3 Drawing Sheets

WIRE BOND MONITORING SYSTEM FOR LAYERED PACKAGES

This is a divisional of prior application No. 08/925,507 filed Sep. 8, 1997 now U.S. Pat. No. 6,085,962.

BACKGROUND OF THE INVENTION

This invention relates generally to wire bonding of integrated circuit devices and particularly to techniques for monitoring wire bonders utilized in connection with making layered packages.

Layered packages are widely utilized in the electronics industry for packaging a variety of devices. They can include laminate packages and single-layered and multi-layered packages. Exemplary laminate packages include those without leadframes such as multichip modules including the MCM-L, MCM-C, and MCM-D packages, without excluding cerdip style packages.

Wire bond machines are used to make connections between various components of layered and non-layered electronic packages. One conventional technique, known as gold ball bonding, involves applying a molten metal ball to a bond location on a die. A ceramic capillary, for example, is then pulled from the bonded ball to a second bond location on a package and a bond is then formed to a lead on the package. The wire is then ripped from the lead, leaving two metal bonds connected by a wire.

Another conventional technique, known as aluminum wedge bonding, uses a wedge that feeds a wire through a clamp. Ultrasonic energy may be used to wedge bond the aluminum wire to form the first bond. The wedge rises, forms a wire loop, moves to the second bond site and forms a second bond like the first bond. The clamp pivots away from the tool to tear the wire at the second bond.

A large number of these connections may be made between a die and a laminate package. Testing of the packaged part for a variety of defects is normally done after the packaging process is complete. Defects may arise from poor bonds, or the total absence of a bonding wire. Poor bonds may occur, for example, due to adhesion problems or due to improper deformation of the wire.

Continuity tests in packages using leadframes are relatively straightforward. Since the leadframe is effectively located in one easily accessible strata, it can readily be accessed for testing to determine whether or not good bonds are made.

Because layered packages are tested after manufacturing, the packaged devices must sometimes be discarded because the bonds were not good. Thus, it would be desirable to have a practical technique for monitoring the wire bond apparatus used to make layered packages.

SUMMARY OF THE INVENTION

In accordance with one aspect of the present invention, a method for wire bonding a layered package having a die and a laminate package comprises the step of making a wire bond to a die. A wire bond is also made to the laminate package. The continuity of the wire bonds to the die and the laminate package are then checked.

In accordance with another aspect of the present invention, a method for wire bonding layered packages having a die and a laminate package includes the step of securing the die to the laminate package. A wire bond connection is made from the die to the laminate package. The continuity of that connection is checked by making an electrical connection to ground through the wire bonder.

In accordance with still another aspect of the present invention, a method for wire bonding layered packages having a die and a laminate package includes the step of securing the die to the laminate package. A wire bond connection is made from the die to the laminate package. The continuity of the connection is checked by making electrical contact to the laminate package through the wire bond clamp and applying a drive signal through the wire bond connection.

In accordance with yet another aspect of the present invention, a wire bond monitoring apparatus includes a continuity tester electrically connectable to a die and a laminate package. A flexible contact is electrically connected to the continuity tester. The flexible contact is arranged to flexibly contact the laminate package to make electrical connection for testing.

DESCRIPTION OF THE PREFERRED EMBODIMENTS

Figure 1:
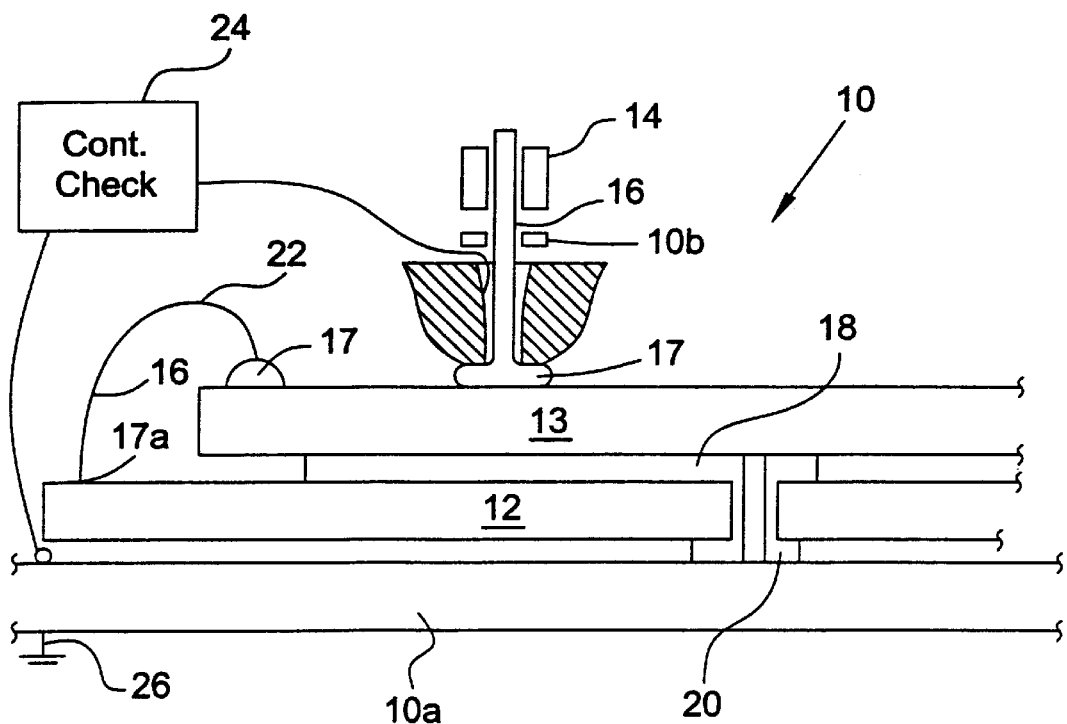
FIG. 1 is a schematic, enlarged cross-sectional view of one embodiment of the present invention.

Referring to the drawing wherein like reference characters are utilized for a like parts throughout the several views, an automatic wire bond machine 10, shown in FIG. 1, may include a heat block 10a, a wire clamp 10b and a wire guide 14. The wire guide 14 guides the wire 16 into contact with the die 13 or the laminate package 12. A ball 17 may be formed at the point of contact.

A laminate package trace 18 makes electrical contact with the back side of the die 13 and communicates through a via 20 with the machine 10. The machine 10, in turn, is connected to the ground 26.

The operation of a conventional wire bonding machine is well known to those skilled in the art. A typical gold ball bond, shown at 22, includes a ball 17 and a wedge bond 17a connecting to each of the surfaces connected by a wire 16.

A continuity tester 24 determines whether there is continuity between the die 13 and the package 12 through a particular wire bonded connection, such as the one shown at 22. Continuity testers 24, in general, are well known to those skilled in the art and any of a variety of devices, including devices which measure voltage or current may be utilized. It may also be desirable to test the high frequency performance of the connection.

The via 20 is effectively a hole through the laminate package 12, which is metal lined so that an electrical connection is made between the metal trace 18 (and the back of the die 13) and the ground 26 through the machine 10.

Since the continuity checker 24 is connected both to the ground 26 and to one of the bonds illustrated as 17 in FIG. 1, the die and laminate package bonds may be tested as each pair of bonds is completed.

After the wire bonder 10 has formed contacts 17 and 17a at both the die 13 and laminate package 12, respectively, connected by a wire 16, a drive signal from the laminate package 12 may be driven through the wire bond connection to the die 13 through the continuity tester 24 and to ground. If the connection made by the wire bonder is defective, the continuity tester 24 can issue an appropriate signal. The wire bonding operation then could be stopped until the source of the problem is determined and fixed.

Figure 8:
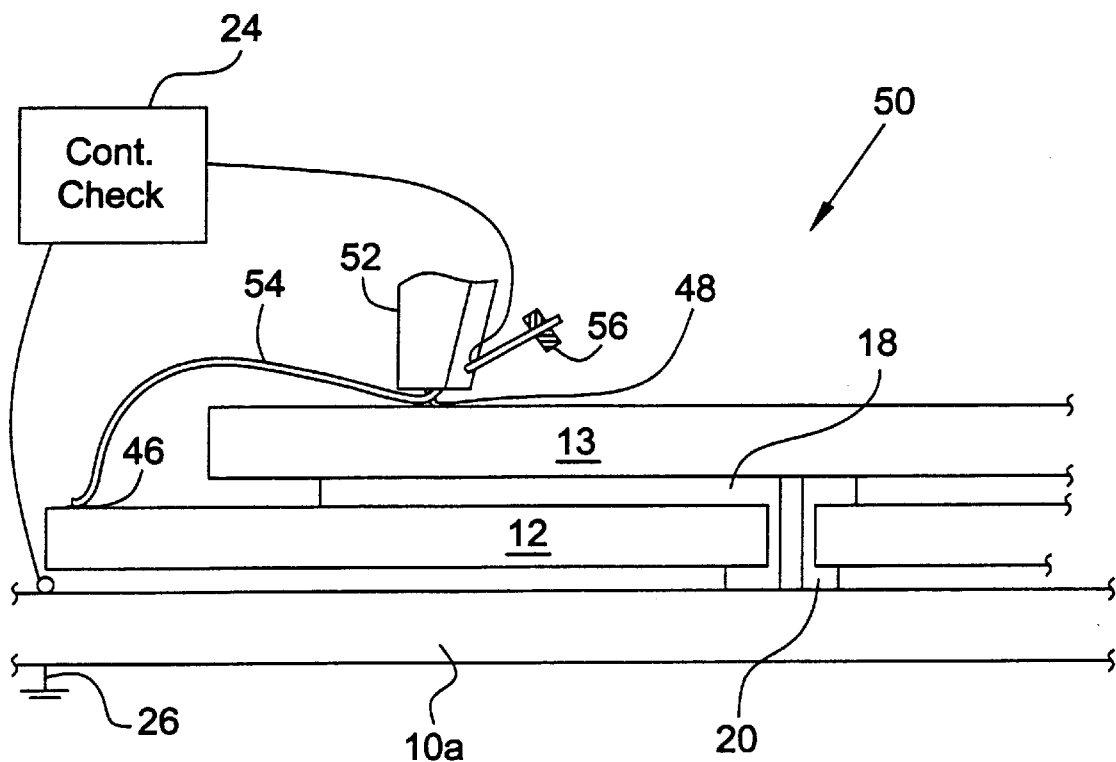
FIG. 8 is a schematic enlarged cross-sectional view of another embodiment.

While the embodiment of FIG. 1 involves a gold bond machine 10, an aluminum wedge bonding machine 50 may be used as well, as shown in FIG. 8. The machine 50 includes a wedge 52, a wire 54, and a clamp 56, capable of forming a first bond 46 on the package 12 and a second bond 48 on the die 13, which is known as reverse bonding. Forward bonding may also be used. The continuity tester 24 contacts the wire 54 to check continuity, as described previously.

Figure 2:
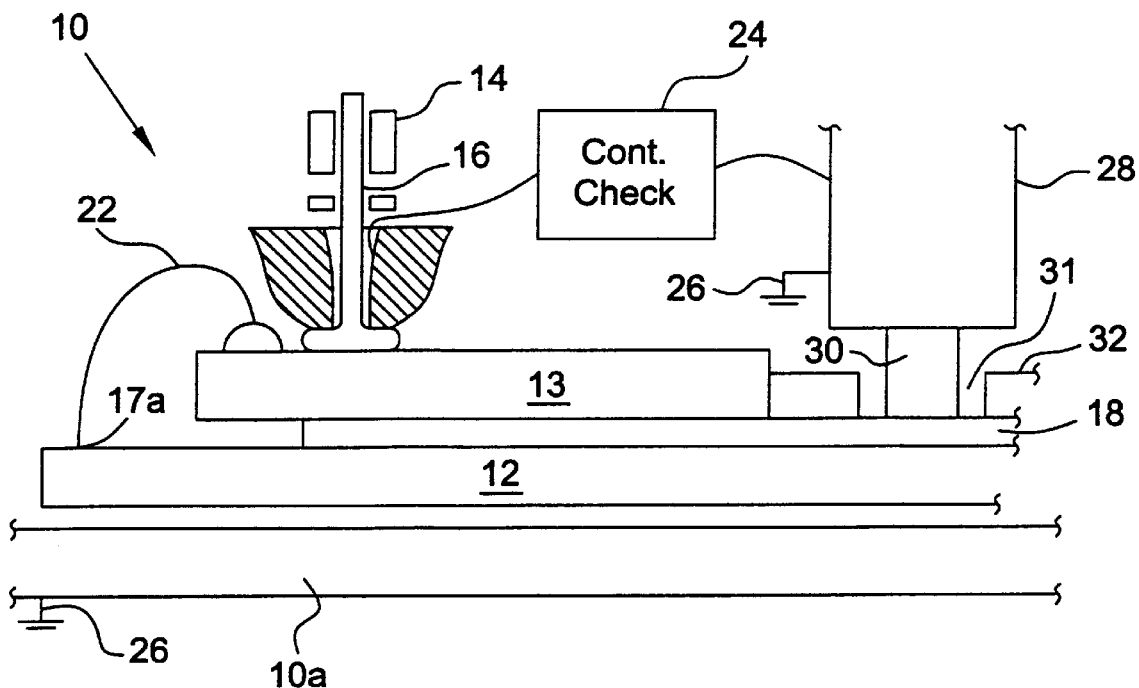
FIG. 2 is a schematic, enlarged cross-sectional view of another embodiment of the present invention.

In some cases, a via 20 may not be available or for other reasons, it may not be possible to make the continuity check by making a connection through the laminate package 12. For example, it may not be possible to make good contact with the back of the die 13. As shown in FIG. 2, a portion of a laminate package metal contact, lead or trace 18, accessible through an opening 31 in a solder mask 32, may then be contacted from above. While the opening 31 may not be of considerable size and access to it may require weaving through the solder mask past the die 13, a connection can be made by the wire bonder clamp 28 to the metal trace 18 using a flexible contact 30. In addition, even if the surface to be contacted is irregular, a good contact can be made using the flexible contact 30. Once the connection 30 is made to the metal trace 18, a drive signal may be driven from a first lead such as an edge connection. The drive signal may communicate through the contact 30 to the trace 18 and then through the bond made on the laminate package 12 through the wire bond 16 to a bond made on the die 13. The check of continuity proceeds through the continuity tester 24 to ground 26.

Through the use of the flexible connection 30, contact may be made in a variety of inaccessible positions to facilitate continuity testing in layered packages. A variety of flexible contacts 30 are illustrated in FIGS. 3 to 6. In some cases a relatively narrow portion 38 is capable of extending through a relatively small opening and flexibly contacting the trace 18.

Figure 3:
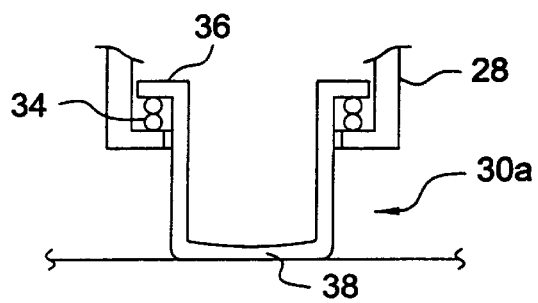
FIG. 3 is an enlarged, cross-sectional view of one embodiment of a flexible contact shown in FIG. 2.

A telescoping spring-biased pin 30a, shown in FIG. 3, includes a flexible member 38 mounted on a coil spring 34. The spring 34 is retained between the housing 28 and the retainer 36. In this way the portion 38 may flexibly and resiliently contact the trace 18 against the bias supplied by the coil spring 34. A variety of devices using spring biased contacts, generally known as "pogo" pins, may be utilized for this purpose.

Figure 4:
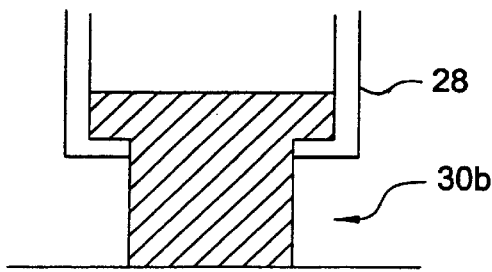
FIG. 4 is an enlarged, cross-sectional view of another embodiment of the flexible contact shown in FIG. 2.

A conductive resilient material 30b may also be used as a contact 30, as shown in FIG. 4. The material may be a Z-axis foam or rubber which is conductive. The material 30b may be a T-shaped so that it may be retained in the clamp 28 while extending downwardly to flexibly and resiliently contact the trace 18.

Figure 5:
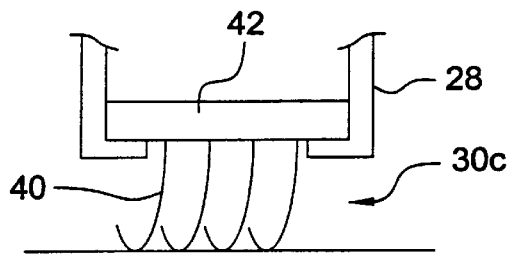
FIG. 5 is an enlarged, cross-sectional view of still another embodiment of the flexible contact shown in FIG. 2.

Alternatively, the flexible contact 30c may be implemented by a plurality of wires or whiskers 40, formed into a J-configuration, as shown in FIG. 5. If desired the whiskers 40 may be straight instead of curved. The whiskers 40 may extend into a fairly narrow location such as a solder mask opening and resiliently contact the trace 18, flexing about their length. The whiskers 40 may be retained in a brush-like fashion by the retainer 42.

Figure 6:
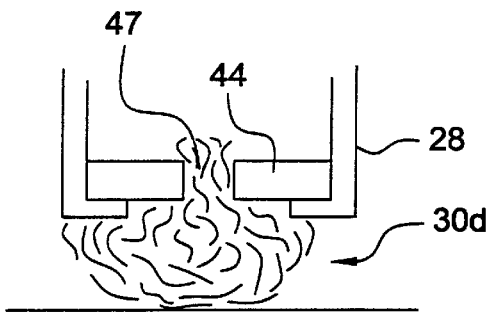
FIG. 6 is an enlarged, cross-sectional view of yet another embodiment of the flexible contact shown in FIG. 2.

Referring next to FIG. 6, the flexible contact 30d is formed on a metal mesh 46 akin to steel wool and containing a plurality of metal fibers held together by interentanglement. The mesh 46 is connected to the frame 28 by the retainer 44. When appropriately positioned, the mesh 46 can make a flexible and resilient electrical contact with the trace 18.

Figure 7:
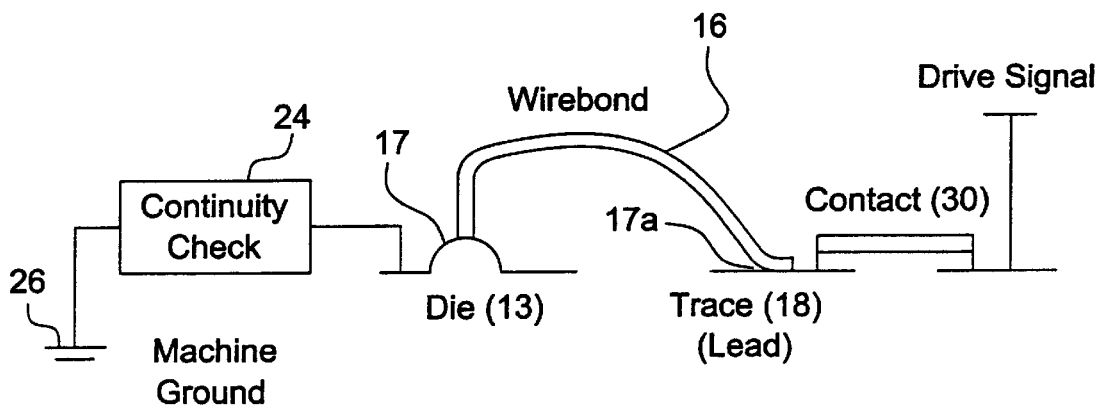
FIG. 7 is a schematic depiction of the continuity test shown in FIG. 2.

Referring now to FIG. 7, the continuity path for the embodiment shown in FIG. 2 begins with a drive signal which arises on the laminate package 12. The drive signal is connected to the trace 18 by the flexible contact 30. The flexible contact 30 may be brought down to contact a plurality of pins on the laminate package using the wire bond machine clamp 28. These pins are all shorted together so that the drive signal is communicated to the trace 18. From the trace 18 and the ball 17 connected thereto, electrical connection is made through the wire bond 16 to the ball 17 connected to the die 13. A check is made by the continuity checker 24 communicating with ground 26. A variety of continuity checks can be utilized including monitoring frequency, current and voltage. Generally a check is made quickly enough to enable the wire bonding apparatus to be stopped before too many wire bonds (which may be defective) are completed.

While the present invention has been described with respect to a limited number of preferred embodiments, those skilled in the art will appreciate numerous modifications and variations. For example, instead of using the flexible contact or via to make a contact, a tie bar may be used for panel form substrates to short all the lead traces and edge connectors. Similarly, where boat or sleeve carriers are used, the edge connectors or traces could be grounded to the conductive boat which is grounded to the wire bond machine. It is intended that the appended claims cover all such variations and modifications that fall within the true spirit and scope of the present invention.

What is claimed is:

1. A wire bond monitoring system comprising:

a wire bonder; and a device to detect the continuity of a wire bond connection made by said wire bonder said wire bonder including a clamp to clamp leads to be wire bonded, said clamp including a flexible electrical contact.

2. The system of claim 1 wherein said contact includes a pogo pin.

3. The system of claim 1 wherein said contact includes a conductive, resilient material.

4. The system of claim 1 wherein said contact includes a resilient metal brush.

5. The system of claim 4 wherein said brush is formed of a plurality of metallic wires.

6. The system of claim 5 wherein said wires are J-shaped.

7. The system of claim 5 wherein said wires are contained in a mesh.

8. A wire bond monitoring system comprising:

a wire bonder; and a device to detect the continuity of a wire bond connection made by said wire bonder, said device including a contact with a conductive, resilient metal brush.

9. The system of claim 8 wherein said brush is formed of a plurality of metallic wires.

\* \* \* \* \*